US008340323B2

(12) United States Patent
Asada et al.

(10) Patent No.: US 8,340,323 B2
(45) Date of Patent: Dec. 25, 2012

(54) SOUND OUTPUTTING APPARATUS, SOUND OUTPUTTING METHOD, SOUND OUTPUTTING SYSTEM AND SOUND OUTPUT PROCESSING PROGRAM

(75) Inventors: Kohei Asada, Kanagawa (JP); Hiroki Kawanishi, Tokyo (JP)

(73) Assignee: Sony Corporation, Tokyo (JP)

(*) Notice: Subject to any disclaimer, the term of this patent is extended or adjusted under 35 U.S.C. 154(b) by 1418 days.

(21) Appl. No.: 11/936,894

(22) Filed: Nov. 8, 2007

(65) Prior Publication Data

US 2008/0170725 A1 Jul. 17, 2008

(30) Foreign Application Priority Data

Jan. 16, 2007 (JP) ................................ 2007-006504

(51) Int. Cl.
*H03G 3/00* (2006.01)
*H03G 5/00* (2006.01)
*H04R 1/10* (2006.01)

(52) U.S. Cl. .......................... 381/107; 381/74; 381/103

(58) Field of Classification Search ................. 381/74.6, 381/93, 57, 107, 74, 103, 83, 94.1, 106
See application file for complete search history.

(56) References Cited

U.S. PATENT DOCUMENTS

| | | | | |
|---|---|---|---|---|
| 5,412,733 | A * | 5/1995 | Nagayoshi et al. | 381/74 |
| 5,450,494 | A * | 9/1995 | Okubo et al. | 381/57 |
| 7,903,825 | B1 * | 3/2011 | Melanson | 381/57 |
| 2003/0108209 | A1 * | 6/2003 | McIntosh | 381/74 |
| 2007/0253569 | A1 * | 11/2007 | Bose | 381/71.6 |

FOREIGN PATENT DOCUMENTS

| | | | |
|---|---|---|---|
| JP | 3-145811 | | 6/1991 |
| JP | 4-123598 | | 4/1992 |
| JP | 04123598 | A * | 4/1992 |
| JP | 4-278796 | | 10/1992 |
| JP | 5-49091 | | 2/1993 |
| JP | 6-6156 | | 1/1994 |
| JP | 8-307986 | | 11/1996 |
| JP | 9-186540 | | 7/1997 |
| JP | 10-56346 | | 2/1998 |
| JP | 2000-190785 | | 7/2000 |
| JP | 2001-136039 | | 5/2001 |
| JP | 2005-223445 | | 8/2005 |
| JP | 2007-88521 | | 4/2007 |
| JP | 2007088521 | A * | 4/2007 |

OTHER PUBLICATIONS

U.S. Appl. No. 12/015,824, filed Jan. 17, 2008, Asada, et al.
U.S. Appl. No. 11/865,419, filed Oct. 1, 2007, Asada, et al.
U.S. Appl. No. 11/865,354, filed Oct. 1, 2007, Asada.
U.S. Appl. No. 11/868,815, filed Oct. 8, 2007, Itabashi, et al.

(Continued)

*Primary Examiner* — Xu Mei
*Assistant Examiner* — David Ton
(74) *Attorney, Agent, or Firm* — Oblon, Spivak, McClelland, Maier & Neustadt, L.L.P.

(57) ABSTRACT

Disclosed herein is a sound outputting apparatus, including: an electro-acoustic conversion section disposed in a housing and configured to acoustically reproduce a first sound signal; a sound collection section configured to collect sound outside said housing and output a second sound signal; a surrounding noise evaluation section configured to evaluate surrounding noise outside said housing based on the second electric signal; and a control section configured to perform predetermined control based on a result of the evaluation of said surrounding noise evaluation section.

14 Claims, 8 Drawing Sheets

OTHER PUBLICATIONS

U.S. Appl. No. 11/875,374, filed Oct. 19, 2007, Asada.
U.S. Appl. No. 11/936,882, filed Nov. 8, 2007, Asada, et al.
U.S. Appl. No. 11/936,876, filed Nov. 8, 2007, Asada, et al.
U.S. Appl. No. 11/952,468, filed Dec. 7, 2007, Asada, et al.
U.S. Appl. No. 11/966,168, filed Dec. 28, 2007, Ohkuri, et al.
U.S. Appl. No. 11/966,452, filed Dec. 28, 2007, Itabashi, et al.
Office Action issued Sep. 13, 2011 in Japanese Patent Application No. 2007-006504.

* cited by examiner

SOUND OUTPUTTING APPARATUS, SOUND OUTPUTTING METHOD, SOUND OUTPUTTING SYSTEM AND SOUND OUTPUT PROCESSING PROGRAM

CROSS REFERENCES TO RELATED APPLICATIONS

The present invention contains subject matter related to Japanese Patent Application JP 2007-006504 filed in the Japan Patent Office on Jan. 16, 2007, the entire contents of which being incorporated herein by reference.

BACKGROUND OF THE INVENTION

1. Field of the Invention

This invention relates to a sound outputting apparatus such as a headphone apparatus and a portable telephone terminal and also to a sound outputting method and a sound output processing program for use with the apparatus as well as a sound outputting system which includes a headphone apparatus and a sound outputting apparatus.

2. Description of the Related Art

In order to acoustically reproduce a reproduction sound signal of a portable audio player so that a listener listens to the sound, usually a headphone apparatus or an earphone apparatus is used such that sound may not leak to the outside.

However, sound leaking from a headphone apparatus has become a social problem as noise or disagreeable sound in an electric train or the like in recent years. Generally, sound leakage from a headphone apparatus in most cases occurs when the reproduction sound volume is set to a comparatively high level by a listener to listen to the reproduction sound.

Against the program just described, a technique of automatically suppressing the maximum sound volume on the audio player side or anther technique of suppressing the reproduction sound pressure using a compressor process or a limiter process has been proposed. The latter technique is disclosed, for example, in Japanese Patent No. 3,016,446 (Japanese Patent Laid-Open No. Hei 05-49091, hereinafter referred to as Patent Document 1).

SUMMARY OF THE INVENTION

However, where an audio player does not have such a compressor processing function or a limiter function as disclosed in Patent Document 1, the fundamental solution may not be reached unless the listener narrows down the sound volume and listens to reproduction sound with a small sound volume.

Incidentally, the listener actually raises the sound volume in most cases where the surrounding environment (listening environment) at a site at which the listener listens is noisy because of noise. However, in this instance, since the listening environment itself is a noisy environment, even if the leaking sound volume is great, surrounding people seldom feel the leaking sound as noise or disagreeable sound.

However, when the listener moves from the noisy listening environment to another place while the sound volume is left set to a high sound volume as described above, if the listener is concentrated in the listening to music, then even if the noise level is lower in the listening environment at the new place, the listener may not become conscious of this frequently. In such an instance, since the surrounding noise is low in the listening environment after the movement, even if the leak sound itself is small in amount, the listening person annoys surrounding people through leaking sound while the listening person itself does not intend this.

Therefore, it is demanded to provide a sound outputting apparatus and method which can solve the problem described above.

According to an embodiment of the present invention, there is provided a sound outputting apparatus including an electro-acoustic conversion section disposed in a housing and configured to acoustically reproduce a first sound signal, a sound collection section configured to collect sound outside the housing and output a second sound signal, a surrounding noise evaluation section configured to evaluate surrounding noise outside the housing based on the second electric signal, and a control section configured to perform predetermined control based on a result of the evaluation of the surrounding noise evaluation section.

In the sound outputting apparatus, the electro-acoustic conversion section acoustically reproduces a first sound signal. Meanwhile, the sound collection section collects sound outside the housing, that is, surrounding noise, and outputs a second sound signal. The surrounding noise evaluation section evaluates the surrounding noise outside the housing based on the second electric signal. The control section performs predetermined control based on a result of the evaluation of the surrounding noise evaluation section.

For example, in a listening environment wherein the surroundings are noisy, since the amount of surrounding noise components is great, even if sound leakage occurs, the other people are less likely to feel the leaking sound as noise or disagreeable sound. Therefore, it is considered unnecessary to suppress the volume of sound to be acoustically reproduced and outputted, and the control section controls so as not to perform narrowing down of the sound volume of the first sound signal or the like.

On the other hand, if the surrounding noise evaluation section evaluates that the surrounding environment is a quiet listening environment, then if sound leakage occurs, then the leaking sound becomes rude to the other people. Therefore, in this instance, the control section can control the volume of the sound based on the result of the evaluation of the surrounding noise evaluation section so that the sound leakage arising from the acoustic reproduction output of the first sound signal.

With the sound outputting apparatus, the surrounding noise evaluation section evaluates the state of the surrounding noise outside the housing based on the second sound signal from the sound collection section. Therefore, it can be decided and evaluated, for example, whether the surrounding environment outside the housing is an environment wherein the surrounding noise is small and leaking sound is likely to be felt as noise or disagreeable sound by the other people or another environment wherein the surrounding noise is great and, even if sound leakage occurs, the leaking sound is less likely to be perceived as noise or disagreeable sound by the other people. Accordingly, the control section can perform more appropriate sound leakage suppression control or can take another countermeasure such as to notify the user of the sound outputting apparatus of the sound leakage and urge the user to pay attention to the sound leakage.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

[First Embodiment]

Figure 1:
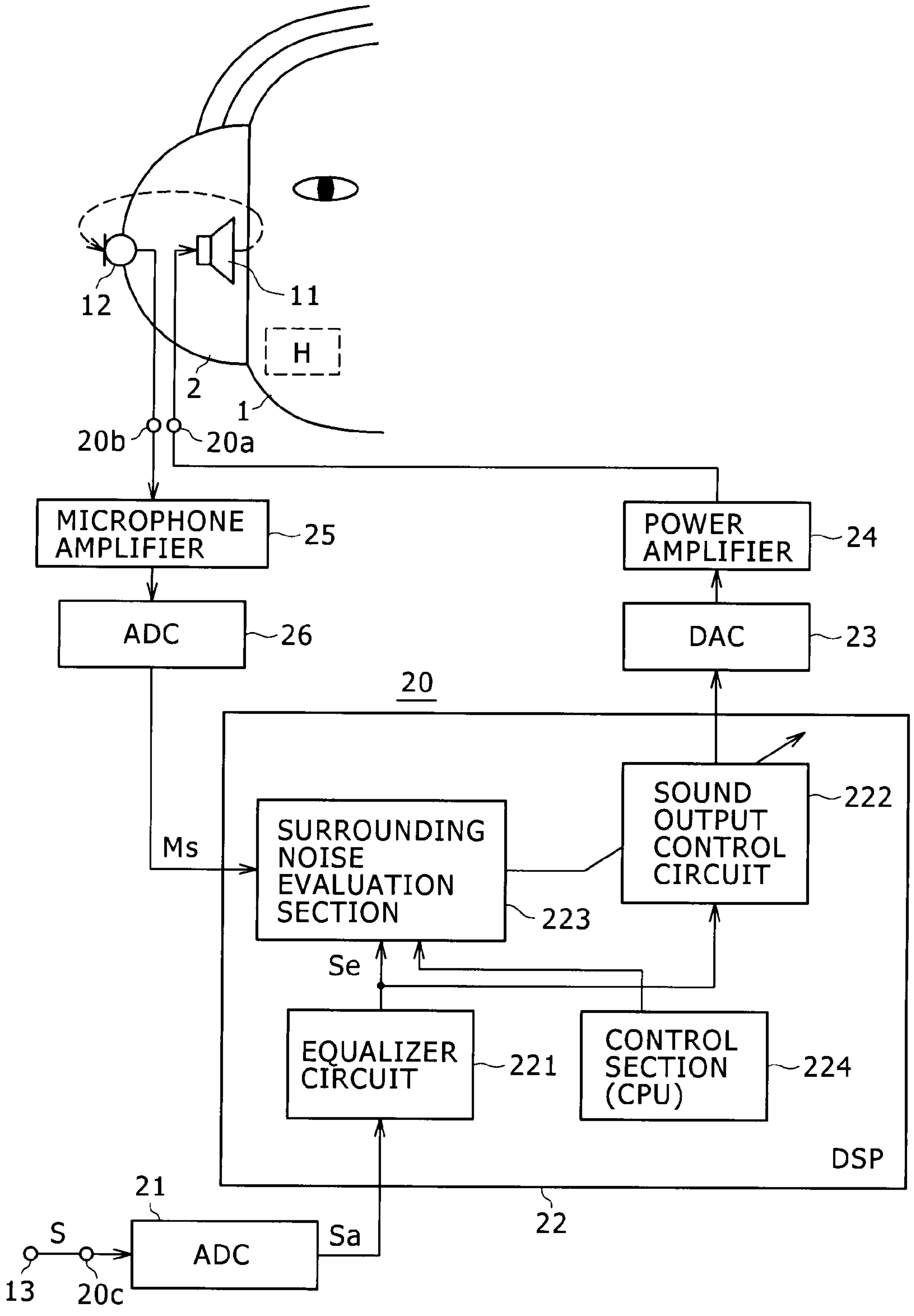
FIG. 1 is a block diagram showing a first embodiment of the present invention wherein a sound outputting apparatus of the present invention is applied to a headphone apparatus.

FIG. 1 shows an example of a configuration of a first embodiment of the present invention wherein a sound outputting apparatus of the present invention is applied to a headphone apparatus.

In FIG. 1, a configuration only of a portion of the headphone apparatus for the right ear side of a listener 1 is shown for simplified illustration. This similarly applies to the other embodiments hereinafter described. Naturally, also the other portion of the headphone apparatus for the left ear side of the listener 1 is configured similarly.

Referring first to FIG. 1, the headphone apparatus is mounted on the listener 1 such that the right ear of the listener 1 is covered with a headphone housing (housing section) 2 for the right ear. A headphone driver unit (hereinafter referred to simply as driver) 11 is provided on the inner side of the headphone housing 2 and serves as an electroacoustic conversion section for acoustically reproducing a sound signal in the form of an electric signal.

A microphone 12 serving as a sound collection section or acousto-electrical conversion section is attached to the outer side of the housing 2 so that it can collect sound or surrounding noise in a surrounding listening environment of the listener 1. In particular, the microphone 12 is attached to a predetermined position of a portion of the housing 2 exposed to the outside such that the microphone 12 collects surrounding noise of the housing 2.

A sound signal input terminal 13 receives a sound signal S of an object of listening. The sound signal input terminal 13 is formed from a headphone plug for being inserted, for example, into a headphone jack of a portable music reproduction apparatus. A sound signal processing section 20 is interposed in a sound signal transmission line between the sound signal input terminal 13 and the drivers 11 and microphones 12 for the left and right ears. The sound signal processing section 20 includes an A/D conversion circuit 21, a digital signal processor (DSP) 22, a D/A conversion section 23, a power amplifier 24, a microphone amplifier 25, and an A/D conversion circuit 26.

Though not shown, the sound signal processing section 20 is connected to the driver 11, microphone 12 and headphone plug which forms the sound signal input terminal 13 by a connection cable. The connection cable has connection terminal portions 20*a*, 20*b* and 20*c* at which the connection cable is connected to the sound signal processing section 20.

A sound signal S from the portable music reproduction apparatus inputted through the sound signal input terminal 13 is converted into a digital sound signal Sa by the A/D conversion circuit 21 and then supplied to the DSP 22.

In the configuration shown in FIG. 1, the DSP 22 includes a digital equalizer circuit 221, a sound output control circuit 222, a surrounding noise evaluation section 223, and a control section 224 including a CPU (Central Processing Unit). The digital sound signal Sa from the A/D conversion circuit 21 is supplied to the digital equalizer circuit 221 in the DSP 22 and undergoes sound quality correction such as amplitude-frequency characteristic correction or phase-frequency characteristic correction or both of them by the digital equalizer circuit 305.

Then, the sound signal Se from the digital equalizer circuit 221 is supplied to the sound output control circuit 222 and the surrounding noise evaluation section 223.

In the present embodiment, in a quiet listening environment wherein the surrounding noise outside the housing 2 is small and, if sound leak occurs, another person is likely to feel the leading sound as noise or disagreeable sound, the sound output control circuit 222 controls the sound volume regarding the sound signal Se so as to be decreased by a prescribed amount determined in advance based on a control signal from the surrounding noise evaluation section 223 as hereinafter described. On the other hand, in a noisy listening environment wherein the surrounding noise outside the housing 2 is high and, even if sound leaks, the user is less likely to feel the leaking sound as noise or disagreeable sound, the sound output control circuit 222 controls the output sound volume regarding the sound signal Se so as to be maintained.

A digital sound signal from the sound output control circuit 222 is supplied to the D/A conversion section 23, by which it is converted into an analog signal. The analog sound signal is supplied through the power amplifier 24 to the driver 11, by which it is acoustically reproduced.

Meanwhile, a sound signal collected by the microphone 12 is supplied through the microphone amplifier 25 to the A/D conversion circuit 26, by which it is converted into a digital sound signal Ms. The digital sound signal Ms is supplied to the surrounding noise evaluation section 223 of the DSP 22.

The surrounding noise evaluation section 223 in principle decides the magnitude of surrounding noise outside the housing 2 principally from the digital sound signal Ms from the A/D conversion circuit 26 to decide and evaluate whether the surrounding environment is a noisy listening environment or a quiet listening environment.

However, where sound leakage to the outside of the housing 2 actually occurs from output sound acoustically reproduced by the driver 11, the surrounding noise collected by the microphone 12 includes the leaking sound. Then, where the leaking sound volume is great, even if the surrounding environment is a quiet environment, there is the possibility that the leaking sound may be detected as surrounding noise.

Therefore, in the present embodiment, taking the problem just described into consideration, the surrounding noise evaluation section 223 removes the component of the leaking sound from the digital sound signal Ms from the A/D conversion circuit 26. Here, since the leaking sound is sound by acoustic reproduction of the sound signal Se from the digital equalizer circuit 221, in the present embodiment, the sound signal Se from the digital equalizer circuit 221 is supplied to the surrounding noise evaluation section 223.

Further, in the present embodiment, the surrounding noise evaluation section 223 decides and evaluates the surrounding noise outside the housing 2 taking not only the digital sound signal Ms from the A/D conversion circuit 26 but also the sound signal Se from the digital equalizer circuit 221 into consideration. In particular, in the present embodiment, if it is decided and evaluated that the surrounding environment is a quiet listening environment, then the surrounding noise evaluation section 223 supplies a signal indicating to lower the sound volume by a prescribed amount as a control signal to be supplied to the sound output control circuit 222 so that sound leakage may not occur as hereinafter described. On the other hand, when it is decided and evaluated that the surrounding noise is high and the surrounding environment outside the housing 2 is noisy listening environment, the surrounding noise evaluation section 223 recognizes that, although sound leakage occurs, it does not have an influence of the other people. Thus, the surrounding noise evaluation section 223 supplies a signal for maintaining the output sound volume as a control signal to be supplied to the sound output control circuit 222.

Consequently, when the surrounding noise evaluation section 223 decides and evaluates that the surrounding noise environment outside the housing 2 is quiet and leaking sound is likely to be felt as rude sound by the other people, the sound output control circuit 222 automatically reduces the sound volume of the sound signal Se to be supplied to the driver 11 to suppress the sound leakage.

In the present embodiment, not the surrounding noise evaluation section 223 normally performs a sound leak evaluation processing operation, but taking such a case that the listening environment varies into consideration, the control section 224 starts a surrounding noise evaluation process by the surrounding noise evaluation section 223 when one of timings specified below is detected by the control section 224.

Examples of the timing at which the control section 224 instructs the surrounding noise evaluation section 223 to start the surrounding noise evaluation process are described below.

(Timing 1)

The control section 224 starts the surrounding noise evaluation process of the surrounding noise evaluation section 223 when a rising edge of a power supply voltage, which is supplied from the portable music reproduction apparatus to the DSP 22, is detected by the control section 224 which includes a CPU after a plug (corresponding to the sound signal input terminal 13) of the headphone apparatus is inserted into a headphone jack of the portable music reproduction apparatus.

(Timing 2)

The surrounding noise evaluation process of the surrounding noise evaluation section 223 is started every time a predetermined period of time measured by the CPU of the control section 224 which counts an internal clock elapses.

(Timing 3)

The control section 224 starts the surrounding noise evaluation process of the surrounding noise evaluation section 223 when it is detected by a decision circuit that a momentary amplitude value or energy value of a time waveform of the digital sound signal Ms or the sound signal Se exceeds a fixed threshold value determined in advance while the CPU of the control section 224 supervises an output of the decision circuit. The decision circuit is provided in the DSP 22 and decides whether or not the momentary amplitude value or energy value which is a detection output of a detection circuit exceeds the fixed threshold value determined in advance. Also the detection circuit is provided in the DSP 22 and detects a momentary amplitude value or energy value of the time waveform of each of the digital sound signal Ms and the sound signal Se.

(Timing 4)

The control section 224 starts the surrounding noise evaluation process of the surrounding noise evaluation section 223 when it is detected by a decision circuit that the frequency amplitude value of the digital sound signal Ms or the sound signal Se as a result of a frequency analysis of an FFT (Fast Fourier Transform) processing circuit exceeds a fixed threshold value determined in advance while the CPU of the control section 224 supervises an output of the decision circuit. The decision circuit is provided in the DSP 22 and decides whether or not the frequency analysis value exceeds the fixed threshold value determined in advance. Also the FFT processing circuit is provided in the DSP 22 and performs a frequency analysis of each of the digital sound signal Ms and the sound signal Se.

(Timing 5)

The control section 224 of the DSP 22 activates the surrounding noise evaluation section 223 when it detects that a predetermined operation is performed by the listener. Here, the detection of the predetermined operation of the user can be implemented, for example, by provision of an operation button not shown on the sound signal processing section 20 so that the control section 224 can detect whether or not the operation button is operated. Or, the control section 224 may start the surrounding noise evaluation process of the surrounding noise evaluation section 223, for example, when it is detected by the CPU in the control section 224 that the housing 2 is beaten by the listener while the CPU supervises a detection output of a detection section. In this instance, the detection section detects from a sound signal from the microphone 12 that the housing 2 is beaten once or a plural number of times by the listener.

In the present embodiment, the surrounding noise evaluation process of the surrounding noise evaluation section 223 is started at all of the timings 1 to 5 specified as above. However, the surrounding noise evaluation process of the surrounding noise evaluation section 223 may be started alternatively at one of the timings 1 to 5 specified as above. Or, the surrounding noise evaluation process of the surrounding noise evaluation section 223 may be started at plural ones extracted from the timings 1 to 5.

It is to be noted, however, that, as regards the sound signal Se, there is the possibility that, for example, within a silent period between different music pieces or some other silent period, when the external listening environment is quiet, a wrong decision may be made. Therefore, the control section 224 does not start the surrounding noise evaluation process of the surrounding noise evaluation section 223 within such a silent period as mentioned above.

Figure 2:
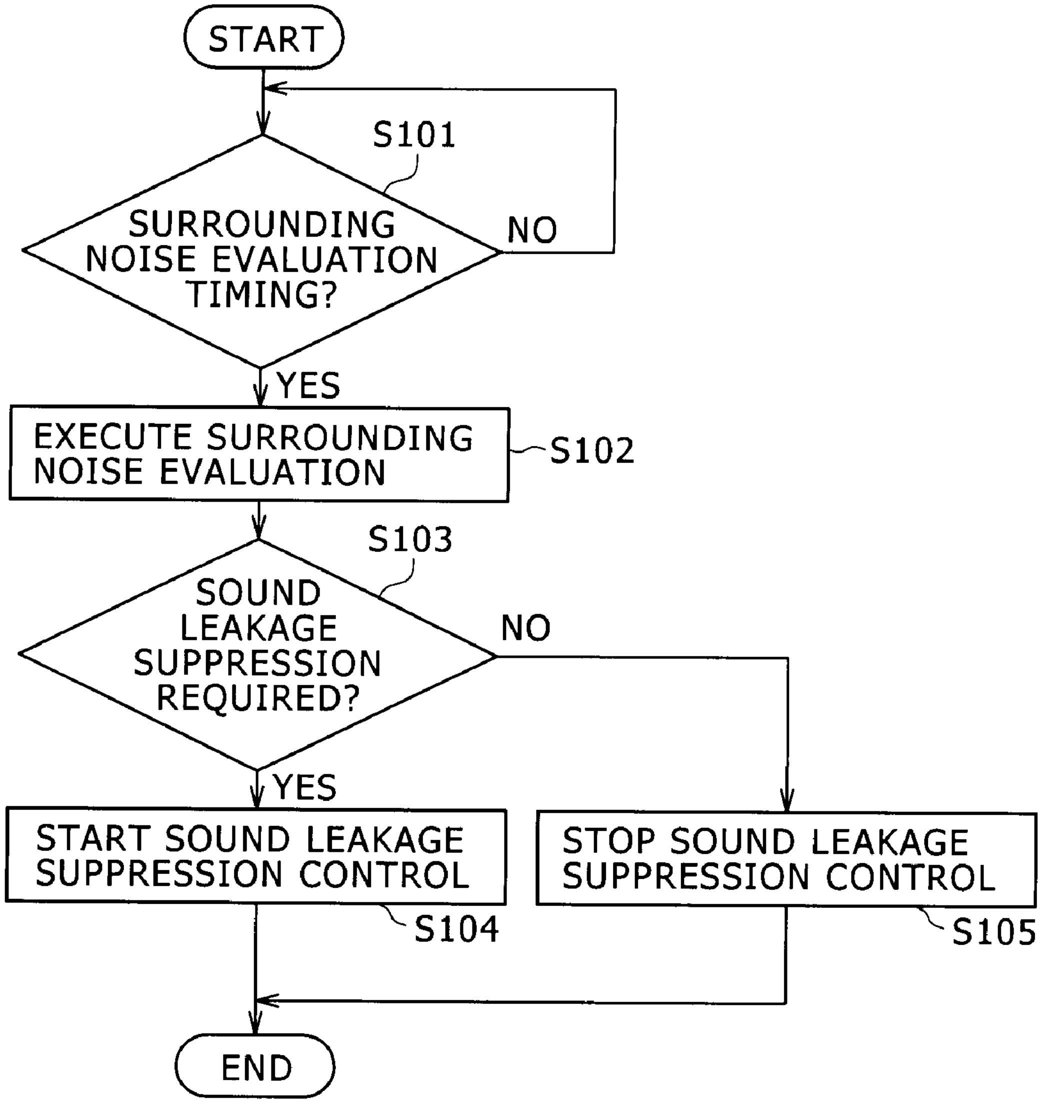
FIG. 2 is a flow chart illustrating an example of processing operation of the headphone apparatus of FIG. 1.

FIG. 2 illustrates timing control for a surrounding noise evaluation process and a sound leakage suppression controlling process by the control section 224 of the DSP 22.

Referring to FIG. 2, the control section 224 first decides whether or not any of the timings 1 to 5 specified as above comes thereby to decide whether or not a surrounding noise evaluation timing comes (step S101). If it is decided that a surrounding noise evaluation timing comes, then the control section 224 activates the surrounding noise evaluation section 223 to execute a surrounding noise evaluation process (step S102).

The surrounding noise evaluation section 223 decides as a result of the execution of the surrounding noise evaluation process whether or not the surrounding listening environment requires sound leakage suppression (step S103). In particular, if the listening environment is a quiet listening environment, then the surrounding noise evaluation section 223 decides that sound leakage suppression is required, but if the listening environment is a noisy environment including much noise, then the control section 224 decides that no sound leakage suppression is required.

If it is decided at step S103 that sound leakage suppression is required, then the surrounding noise evaluation section 223 supplies a sound leakage suppression control execution signal to the sound output control circuit 222 to start sound leakage suppression control (step S104). On the other hand, if it is decided at step S103 that sound leakage suppression is not required, then the surrounding noise evaluation section 223 supplies a sound leakage suppression control stopping signal for stopping the sound leakage suppression control to the sound output control circuit 222 to stop the sound leakage suppression control so that the sound signal Se is outputted to the power amplifier 24 while the sound volume set by the listener is maintained (step S105).

[Example of the Configuration of the Sound Output Control Circuit 222]

In the present embodiment, the sound output control circuit 222 includes a sound leakage suppression control processing function so that, while it receives the sound leakage suppression control execution signal, it executes the sound leakage suppression control process, but while it receives the sound leakage suppression control stopping signal, it does not perform the sound leakage suppression control process and outputs the sound signal Se from the digital equalizer circuit 221 as it is as described hereinabove. For the sound leakage suppression control process by the sound output control circuit 222, a sound volume reduction process for reducing the sound volume by a prescribed amount is used. However, the sound leakage suppression control process is not limited to this.

For example, the sound leakage suppression control processing function may be configured such that a compressor process or a limiter process may be performed to prevent the sound volume from increasing exceeding a predetermined upper limit determined in advance. In particular, when the sound volume is equal to or lower than the upper limit, the sound volume reduction is not performed, but when the sound signal has a sound volume higher than the upper limit, suppression control (compressor control) is performed so that the sound volume does not exceed the upper limit, or the maximum value of the sound volume is limited (limiter process) to the upper limit value.

Or, the sound volume may be controlled so that only signal components in a frequency band (for example, 1 to 3 kHz) of such sound which is felt rude by the other people as leak sound as mentioned hereinabove are reduced.

Further, where the sound volume reduction process for reducing the sound volume by a prescribed amount is used as a sound leakage suppression control process, the sound volume reduction process may always be used. However, the sound volume reduction process may otherwise be performed only when a result of inspection of the sound level (gain) of the sound signal Se from the digital equalizer circuit 221 indicates that the sound volume level is high.

It is to be noted that, as a method of inspecting the sound volume level in this instance, not only a method of inspecting the signal level of the sound signal Se but also a method of using sound volume information acquired from a sound reproduction apparatus which supplies the sound signal S to the sound outputting apparatus of the present embodiment may be used.

[Examples of the Configuration of the Surrounding Noise Evaluation Section 223]

Now, several examples of the configuration of the surrounding noise evaluation section 223 are described.

FIRST EXAMPLE

Figure 3:
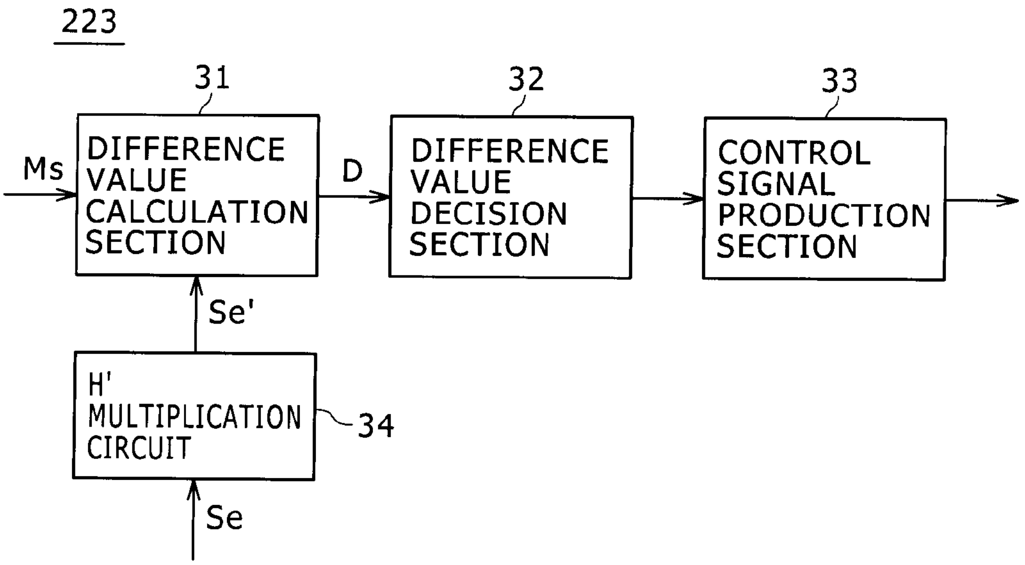
FIGS. 3 and 4 are block diagrams showing different examples of a configuration of a surrounding noise decision evaluation section of the headphone apparatus of FIG. 1.

FIG. 3 shows a first example of a configuration of the surrounding noise evaluation section 223. Referring to FIG. 3, the surrounding noise evaluation section 223 shown includes a difference value calculation section 31, a difference value decision section 32, a control signal production section 33 and an H' multiplication circuit 34.

Where the transfer function from the driver 11 in the housing 2 to the microphone 12 outside the housing 2 is represented by H as seen in FIG. 1, when reproduction sound acoustically reproduced by the driver 11 leaks to the outside from within the housing 2, it can be estimated using the transfer function H what time waveform is indicated at the position of the microphone 12.

In the present embodiment, while the surrounding noise evaluation section 223 removes a leaking sound component of acoustic reproduction sound of the sound signal Se to the outside of the housing 2 from the digital sound signal Ms, the signal to be removed is not the sound signal Se itself but a signal Se' produced so that it may become reproduction sound at the position of the microphone 12 taking the transfer function H into consideration.

A known value can be used as the transfer function H by measuring the same in advance. The transfer function H itself includes much resonance and reflection components in the housing 2 and is in most cases complicated. Therefore, a transfer function H' obtained by approximating the characteristic of the transfer function H is used actually from a relationship of the communication amount.

In particular, in the present embodiment, the sound signal Se of the digital equalizer circuit 221 is supplied to the H' multiplication circuit 34, by which it is multiplied by the transfer function H' to produce a signal Se'. The signal Se' corresponds to sound leaking from the housing 2 when the sound signal Se is acoustically reproduced by the driver 11 and collected by the microphone 12 as described hereinabove.

Accordingly, a difference of a result when the signal Se' is subtracted from the digital sound signal Ms can be made only the external noise component collected by the microphone 12. Consequently, improvement of the surrounding noise evaluation decision accuracy can be anticipated.

Incidentally, when the transfer function H is used for mathematical operation, FIR (Finite Impulse Response) mathematical operation of the transfer function H of the same is performed frequently. However, the FIR mathematical operation consumes much computer resources where a DSP or a CPU is used for the mathematical operation. Therefore, in the present embodiment, the transfer function H' obtained by approximating the characteristic of the transfer function H is used such that the H' multiplication circuit 34 is implemented as an IIR (Infinite Impulse Response) filter to eliminate the problem described hereinabove.

Taking the foregoing into consideration, in the present embodiment, the digital sound signal Ms is supplied to the difference value calculation section 31 while also the signal Se' from the H' multiplication circuit 34 is supplied to the difference value calculation section 31. The difference value calculation section 31 thus subtracts the digital sound signal Se' from the digital sound signal Ms to obtain a difference value D which is the acoustic reproduction sound of the driver 11 from which the leaking sound component to the outside of the housing 2 is removed.

The difference value D determined by the difference value calculation section 31 is supplied to the difference value decision section 32. The difference value decision section 32 determines an energy value of the difference value D within a prescribed interval corresponding to a predetermined time length determined in advance and decides whether or not the determined energy value is equal to or higher than a threshold value Eth determined in advance.

Here, the length of the prescribed interval is a length of time sufficient to decide surrounding noise and particularly is, for example, where the sampling frequency Fs of the digital sound signal is 48 kHz, a period corresponding to 4,096 samples.

Then, if it is decided that the energy value of the difference value D within the prescribed interval is equal to or higher than the threshold value Eth determined in advance, then the difference value decision section 32 decides that the surrounding environment is a noisy listening environment wherein surrounding noise is high. Thus, the difference value decision section 32 supplies information of the result of the decision to the control signal production section 33.

On the other hand, if it is decided that the energy value of the difference value D within the prescribed interval is lower than the threshold value Eth determined in advance, then the difference value decision section 32 decides the surrounding environment is a quiet listening environment which includes low surrounding noise. Thus, the difference value decision section 32 supplies information of the result of the decision to the control signal production section 33.

The control signal production section 33 produces and outputs, if the surrounding listening environment is a quiet listening environment and sound leakage suppression is required based on the information of the result of the decision from the difference value decision section 32, a sound leakage suppression starting execution signal to the sound output control circuit 222. On the other hand, if the surrounding listening environment is a noisy listening environment and sound leakage suppression is not required, then the control signal production section 33 produces and outputs a sound leakage suppression control stopping signal to the sound output control circuit 222.

Consequently, the sound output control circuit 222 performs sound leakage suppression control in a listening environment wherein sound leakage suppression is required, but if the sound leakage suppression becomes unnecessary, then the sound leakage suppression control is stopped and the sound signal Se is acoustically reproduced by the driver 11 while the sound volume and so forth remain in a state set by the listener.

It is to be noted that the necessity for sound leakage suppression may be determined not based on the energy value of the difference value D within a prescribed period determined in advance but based on the maximum amplitude value of the difference value D within the prescribed period by the difference value decision section 32. In this instance, if the maximum amplitude value is lower than a threshold value determined in advance, then the difference value decision section 32 determines that the surrounding listening environment is a quiet listening environment wherein the surrounding noise is low and sound leakage suppression is required. However, if the maximum amplitude value described above is equal to or higher than the threshold value determined in advance, then the difference value decision section 32 determines that the surrounding listening environment is a noisy listening environment wherein the surrounding noise is high and no sound leakage suppression is required.

It is to be noted that the H' multiplication circuit 34 in FIG. 3 may be replaced by a circuit which convolutes the transfer function h' (relating to the transfer function H') in the sound signal Se on the time axis.

SECOND EXAMPLE

Figure 4:
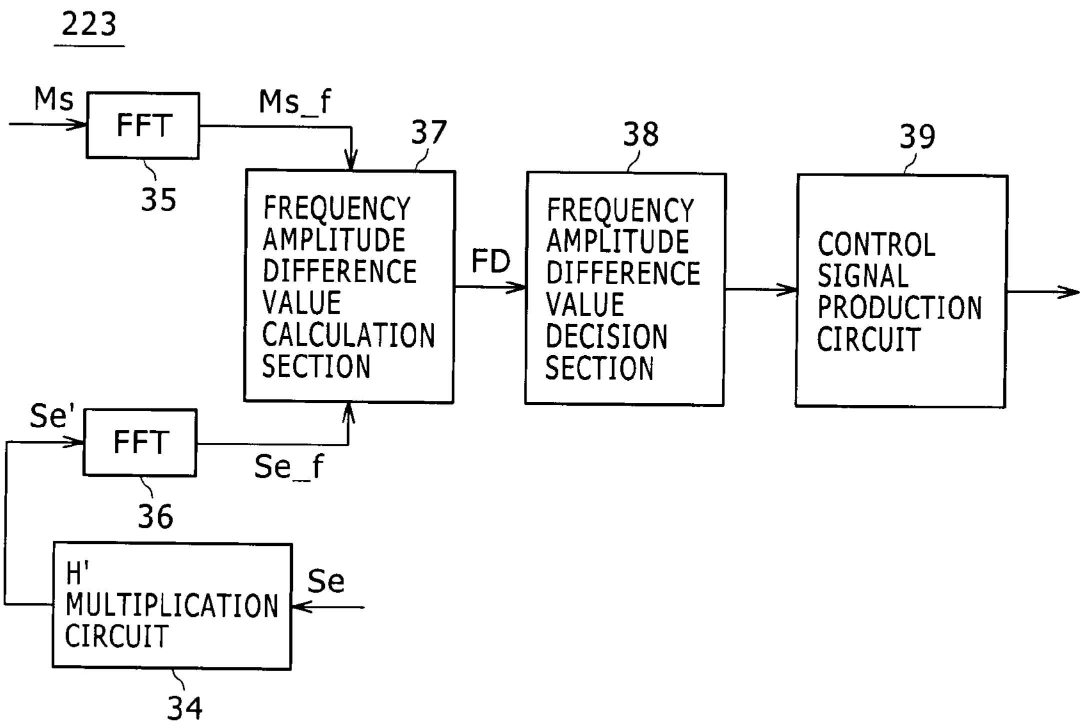

FIG. 4 shows a second example of the configuration of the surrounding noise evaluation section 223. The surrounding noise evaluation section 223 shown in FIG. 4 converts the digital sound signal Ms and the signal Se' from signals in the time domain into signals in the frequency domain such that the subtraction between the signals Ms and Se' is performed in the frequency region to determine a difference value.

Referring to FIG. 4, in the present second example, the surrounding noise evaluation section 223 includes an H' multiplication circuit 34, a pair of FFT processing circuits 35 and 36, a frequency amplitude difference value calculation section 37, a frequency amplitude difference value decision section 38, and a control signal production circuit 39.

The FFT processing circuit 35 converts the digital sound signal Ms, for example, within the prescribed interval from a signal in the time domain into another signal in the frequency domain, and supplies the signal Ms_f in the frequency domain after the conversion to the frequency amplitude difference value calculation section 37.

Similarly, the FFT processing circuit 36 converts the signal Se', for example, within the prescribed interval from the H' multiplication circuit 34 from a signal in the time domain into another signal in the frequency domain, and supplies the signal Se_f in the frequency domain after the conversion to the frequency amplitude difference value calculation section 37.

The frequency amplitude difference value calculation section 37 determines a difference between the signal Se_f and the signal Ms_f in the frequency domain. In particular, the frequency amplitude difference value calculation section 37 determines a difference between the signal Se_f and the signal Ms_f for each frequency and calculates the energy value or the maximum value of the differences as a parameter for decision of the correlativity.

Here, the frequency amplitude difference value calculation section 37 may raise the weight of difference values in advance, for example, within a frequency band (for example, 1 kHz to 3 kHz) of rude sound within which sound leakage is likely to occur, or may raise the weight of difference values in the low frequency region within which surrounding noise is likely to be generated.

The individual frequency difference values FD determined by the frequency amplitude difference value calculation section 37 are supplied to the frequency amplitude difference value decision section 38. The frequency amplitude difference value decision section 38 decides whether or not sound leakage suppression is required similarly as in the first example. In particular, the frequency amplitude difference value decision section 38 determines the total value of the energy values of the individual frequency difference values Fd within a prescribed interval of a predetermined time length determined in advance. Then, the frequency amplitude difference value decision section 38 decides whether or not the determined total value of the energy values of the individual frequency difference values Fd is equal to or higher than a threshold value determined in advance.

The frequency amplitude difference value decision section 38 decides, if it decides that the determined total value of the energy values of the individual frequency difference values FD within the prescribed interval is equal to or higher than the threshold value determined in advance, that the surrounding noise is high and the listening environment is a noisy listening environment. Then, the frequency amplitude difference value decision section 38 supplies information of the result of the decision to the control signal production circuit 39.

On the other hand, if the frequency amplitude difference value decision section 38 decides that the determined total value of the energy values of the individual frequency difference values FD within the prescribed interval is lower than the threshold value determined in advance, then it determines that the surrounding noise is low and the listening environment is a quiet listening environment. Then, the frequency amplitude difference value decision section 38 supplies information of the result of the decision to the control signal production circuit 39.

If sound leakage suppression is required based on the information of the result of the decision from the frequency amplitude difference value decision section 38, then the control signal production circuit 39 produces and outputs a sound leakage suppression starting execution signal to the sound output control circuit 222. However, if sound leakage suppression is not required, then the control signal production circuit 39 produces and outputs a sound leakage suppression control stopping signal to the sound output control circuit 222.

Consequently, the sound output control circuit 222 performs sound leakage suppression control in a listening environment wherein sound leakage suppression is required. However, if the sound leakage suppression becomes unnecessary, then the sound output control circuit 222 stops the sound leakage suppression control and the sound signal Se is acoustically reproduced by the driver 11 while the sound volume and so forth remain in a state set by the listener.

[Second Embodiment]

In the first embodiment described hereinabove, surrounding noise evaluation and decision are performed for the entire frequency band of the sound signal Se and the digital sound signal Ms. However, such surrounding noise evaluation and decision may be performed only for a frequency band (for example, 1 kHz to 3 kHz) of such rude noise as described above. The second embodiment of the present invention performs such surrounding noise evaluation and decision as just described.

Figure 5:
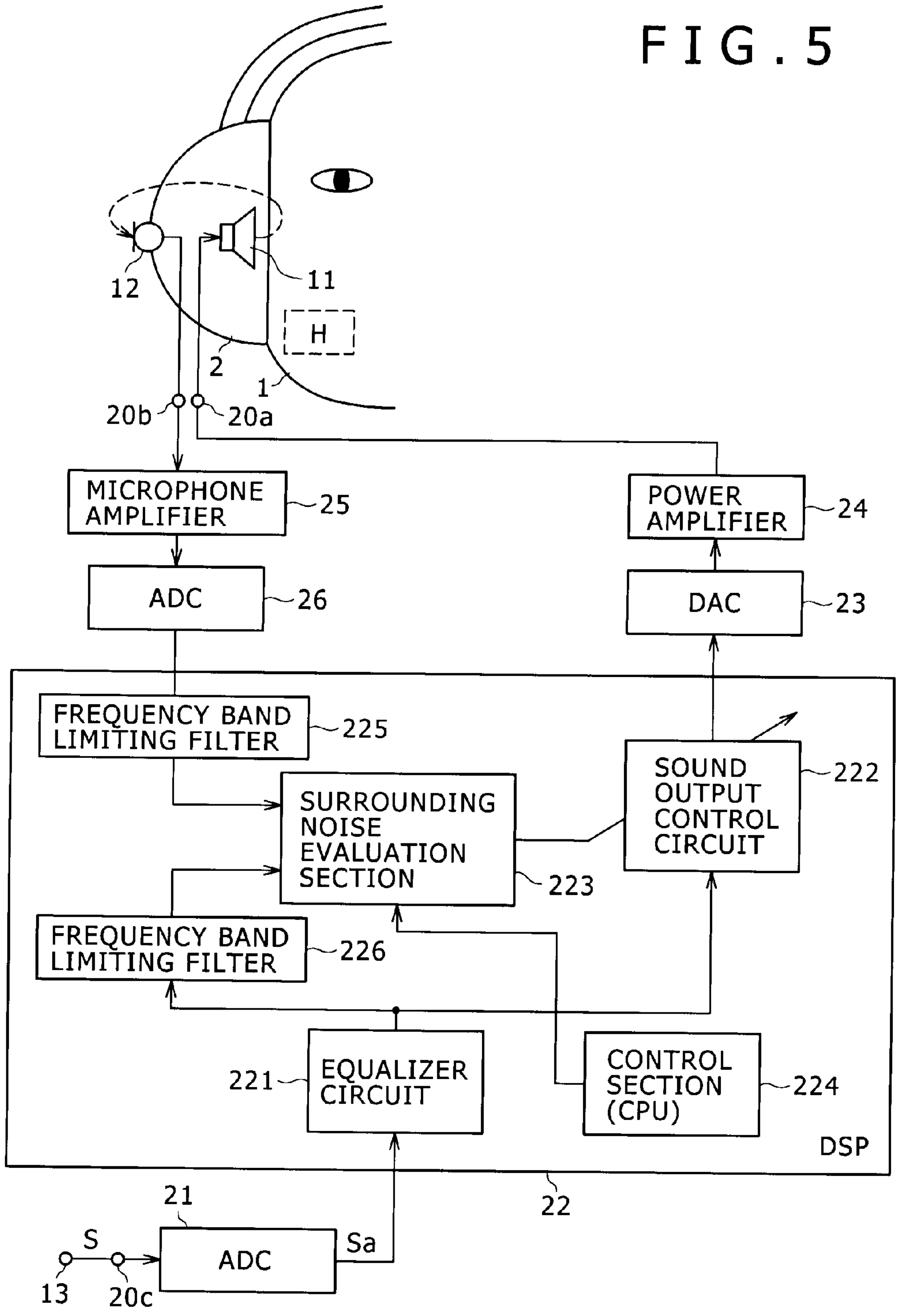
FIGS. 5 to 8 are block diagrams showing second to fifth embodiments of the present invention wherein the sound outputting apparatus of the present invention is applied to a headphone apparatus.

FIG. 5 shows an example of a configuration of a headphone apparatus of the second embodiment of the present invention. The headphone apparatus of the second embodiment is a modification to but is different from the headphone apparatus of the first embodiment in that the digital sound signal Ms from the A/D conversion circuit 26 is supplied to the surrounding noise evaluation section 223 through a frequency band limiting filter 225 which has a pass band of, for example, 1 to 3 kHz. Meanwhile, the sound signal Se from the digital equalizer circuit 221 is supplied to the surrounding noise evaluation section 223 through another frequency band limiting filter 226 which has a pass band of, for example, 1 to 3 kHz.

With the headphone apparatus of the second embodiment, sound leakage suppression control is performed very efficiently when rude sound which is felt particularly rude to the other person is high.

[Third Embodiment]

In the first and second embodiments, when sound leakage occurs, the sound leakage suppression control process is performed for the sound signal Se. However, sound leakage can be prevented otherwise by notifying the listener that the surrounding listening environment is a quiet listening environment wherein leaking sound is likely to be perceived such that the listener receiving the notification performs by itself such an operation as to narrow down the sound volume.

From this point of view, in the present third embodiment, an attention message which notifies the listener that the surrounding listening environment is quiet and sound leakage is likely to be perceived and urges the listener to take such a countermeasure as to narrow down the sound volume so that such leaking sound may be reduced is conveyed to the listener based on information of a result of decision of whether or not sound leakage suppression is required from the surrounding noise evaluation section 223.

Figure 6:
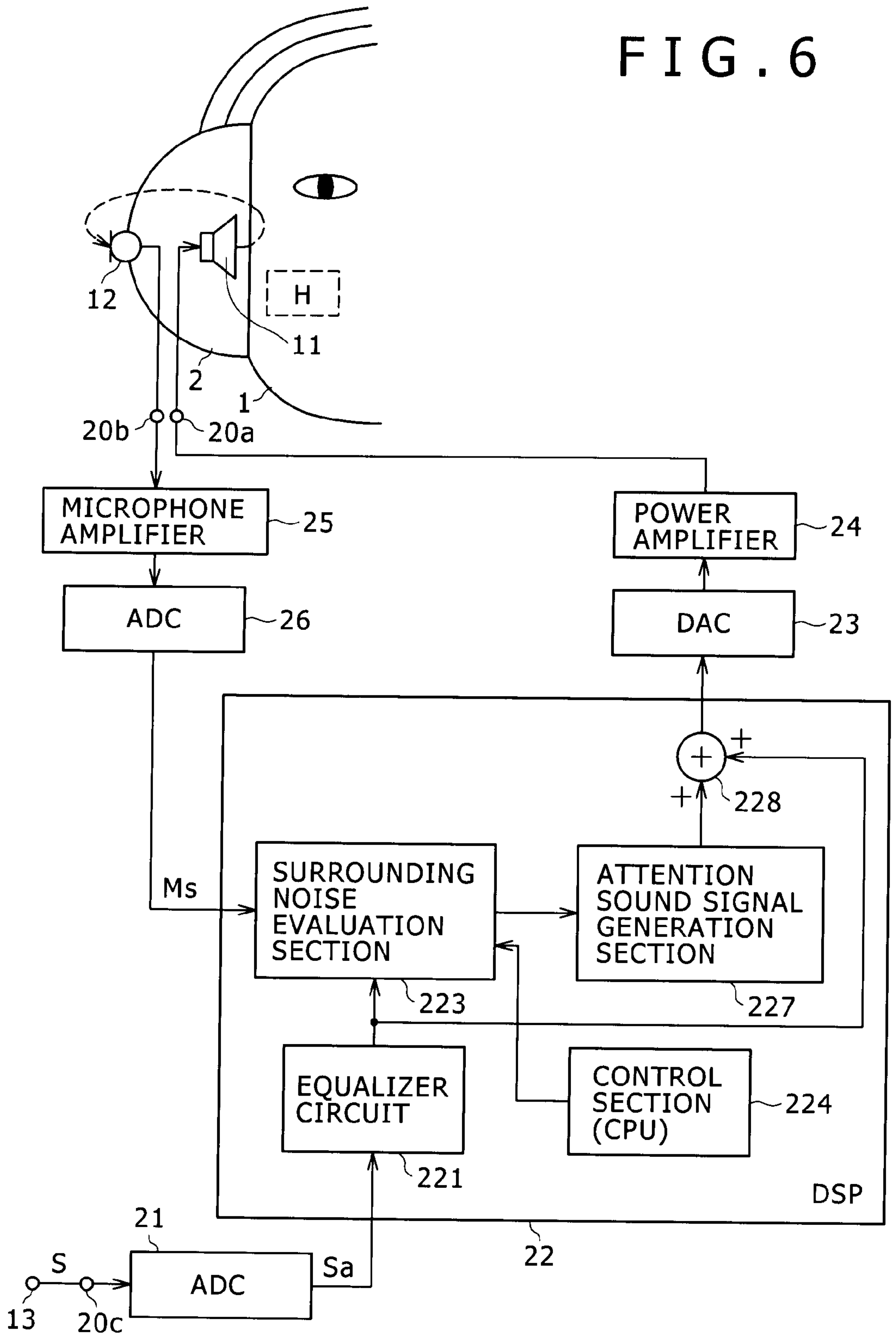

FIG. 6 shows an example of a configuration of a headphone apparatus of the third embodiment of the present invention. The headphone apparatus of the third embodiment is a modification to but is different from the headphone apparatus of the first or second embodiment. In particular, referring to FIG. 6, in the headphone apparatus shown, an attention sound signal generation section 227 is provided in place of the sound output control circuit 222. To the attention sound signal generation section 227, information of a result of a decision of whether or not sound leakage suppression is required from the surrounding noise evaluation section 223 is supplied as an output control signal of the attention sound message.

The attention sound signal generation section 227 includes a memory in which such a sound message as "You are in an environment in which leak sound is likely to be perceived. Please narrow down the sound volume." is stored, and a readout control section for controlling the memory. The readout control section controls readout of the attention sound signal of the sound message in response to information of the result of the decision of whether or not sound leakage suppression is required from the surrounding noise evaluation section 223.

In particular, if the information of the result of the decision of whether or sound leakage suppression is required from the surrounding noise evaluation section 223 represents that sound leakage suppression is required, then the readout control section of the attention sound signal generation section 227 reads out the attention sound signal from the memory and supplies the attention sound signal to an addition circuit 228.

On the other hand, if the information of the result of the decision of whether or not sound leakage suppression is required from the surrounding noise evaluation section 223 represents that sound leakage suppression is not required, then the readout control section of the attention sound signal generation section 227 stops the reading out of the attention sound signal from the memory or does not read out the attention sound signal from the memory. Accordingly, the attention sound signal is not supplied to the addition circuit 228.

Meanwhile, the sound signal Se from the digital equalizer circuit 221 is supplied as it is to the addition circuit 228. Then, an output sound signal from the addition circuit 228 is supplied to the D/A conversion section 23 and then through the power amplifier 24 to the driver 11, by which it is acoustically reproduced.

Since the earphone apparatus according to the third embodiment of the present invention is configured in such a manner as described above, where the situation is such that it is decided by the surrounding noise evaluation section 223 that sound leakage suppression is required, the attention or alarming sound signal is added to the sound signal Se by the addition circuit 228 and then supplied to the driver 11, by which it is acoustically reproduced.

Then, if the listener performs such an operation as to narrow down the sound volume for the sound signal Se in response to the acoustically reproduced warning sound signal, then the earphone apparatus is placed into a state wherein the surrounding noise evaluation section 223 decides that sound leakage suppression is not required any more. Consequently, the reading out of the warning sound signal from the attention sound signal generation section 227 is stopped. If the listener does not perform such an operation as to narrow down the sound volume for the sound signal Se and the situation that it is decided by the surrounding noise evaluation section 223 that sound leakage suppression is required continues, then the attention message continues to be reproduced while the situation continues.

It is to be noted that, in this instance, after the attention sound signal generation section 227 reads out the attention sound signal once or a plural number of times such as two times and supplies the attention sound signal to the addition circuit 228, later reading out of the attention sound signal may be stopped.

In this manner, with the headphone apparatus of the third embodiment, since the listener may perform such an operation, for example, as to narrow down the sound volume as to prevent sound leakage in response to the attention sound message, sound leakage can be suppressed but indirectly.

It is to be noted that, in the third embodiment described above, the attention sound message is added to and acoustically reproduced together with the sound signal Se to be supplied to the driver 11. However, the attention sound message may not be added to the sound signal Se, but, for example, a buzzer may be provided so as to generate buzzer sound, or warning sound such as beep sound may be generated to cause the listener to pay attention to generation of sound leakage and urge the listener to perform a sound leakage suppression operation.

It is to be noted that, in place of issuance of a sound message or warning sound, a display section may be provided so as to display an attention message or warning, or such an indication method as to cause an attention lamp or a warning lamp to flicker may be used instead.

[Fourth Embodiment]

In the headphone apparatus of the embodiments described above, the sound signal collected by the microphone 12 disposed at a portion of the housing 2 exposed to the outside is used for surrounding noise evaluation and decision together with the sound signal Se. However, the microphone 12 may be provided especially for such surrounding noise evaluation and decision or may be a microphone installed for some other function.

Figure 7:
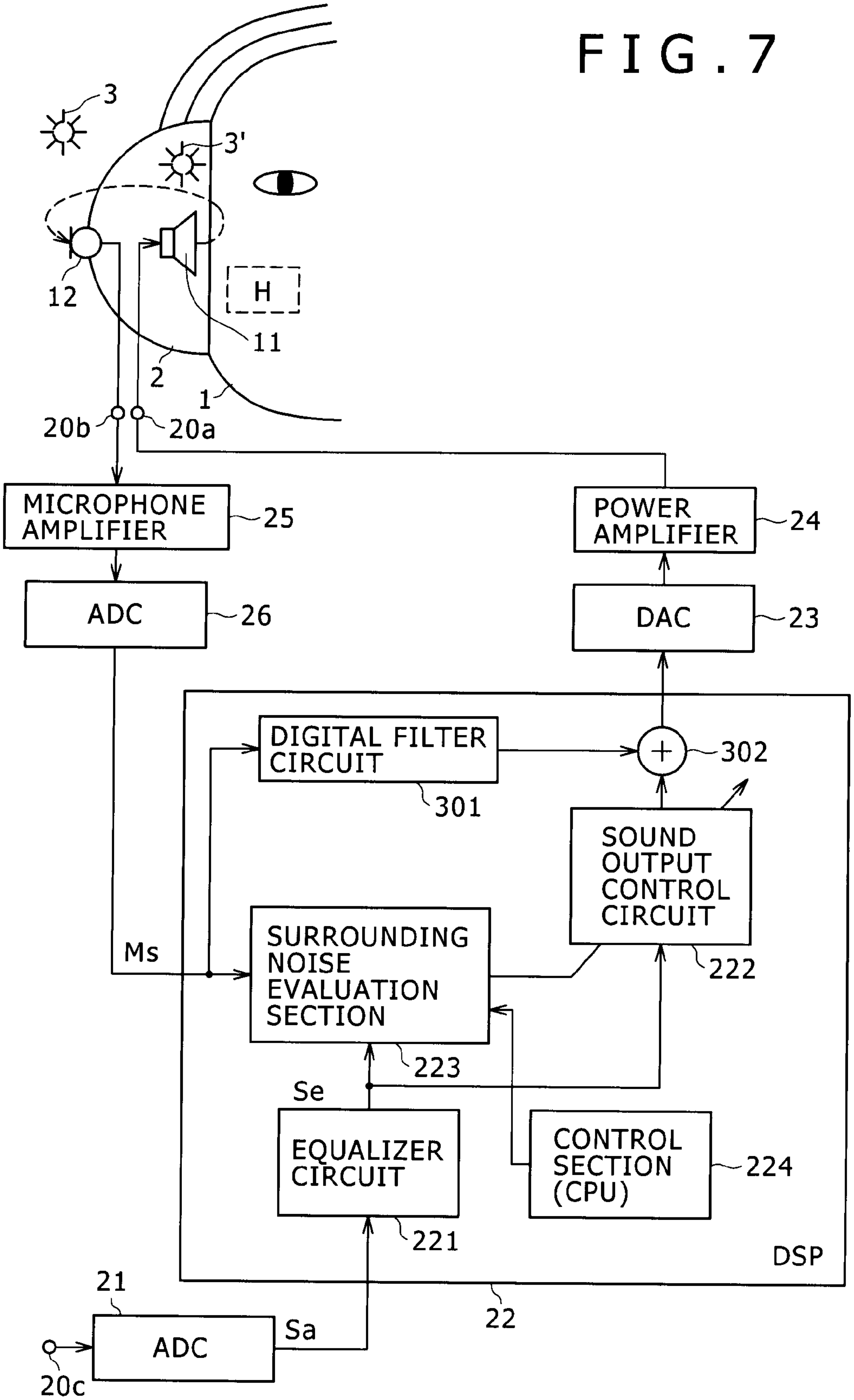

FIG. 7 shows a headphone apparatus according to a fourth embodiment of the present invention wherein, as the microphone 12, a microphone provided for the implementation of a noise reduction function of the feedforward type is used.

In the fourth embodiment, the headphone apparatus is generally configured such that noise entering to a music listening position of the listener 1 within the housing 2 from a noise source 3 outside the housing 2 in a music listening environment of the listener 1 is reduced using the feedforward system so that the listener 1 can listen to music in a good environment.

The noise reduction system of the feedforward type is basically configured such that, as seen in FIG. 7, an appropriate filtering process is performed for noise 3 collected by the microphone 12 disposed outside the housing 2 to produce a noise reduction sound signal and the produced noise reduction sound signal is acoustically reproduced by the driver 11 inside the housing 2 so that the noise (noise 3') is canceled at a position near to the ear of the listener 1.

The noise 3 collected by the microphone 12 and the noise 3' in the housing 2 have different characteristics depending upon the difference between the spatial positions of them including the difference between the outside and the inside of the housing 2. Accordingly, in the feedforward system, the noise reduction sound signal is produced taking the difference in spatial transfer function between the noise from the noise source 3 collected by the microphone 12 and the noise 3' at the noise cancel point Pc into consideration.

In the present embodiment, a digital filter circuit 301 is used as a noise reduction sound signal production section of the feedforward type. The digital filter circuit 301 in the present embodiment is formed in the DSP 22.

A sound signal collected and obtained by the microphone 12 is supplied through the microphone amplifier 25 to and converted into a digital sound signal Ms by the A/D conversion circuit 26. Then, the digital sound signal Ms is supplied to the digital filter circuit 301 of the DSP 22.

The digital filter circuit 301 produces a digital noise reduction sound signal of a characteristic corresponding to a filter coefficient as a parameter set thereto from the digital sound signal Ms inputted thereto. Though not shown, a filter coefficient to be set to the digital filter circuit 301 is prepared in advance in the DSP 22.

The digital noise reduction sound signal produced by the digital filter circuit 301 is supplied to an addition circuit 302, by which it is added to the sound signal from the sound output control circuit 222. An output signal of the addition circuit 302 is supplied to and converted into an analog sound signal by the D/A conversion section 23 and then supplied to the driver 11 through the power amplifier 24.

The sound acoustically reproduced and emitted from the driver 11 includes an acoustic reproduction component originating from the noise reduction sound signal produced by the digital filter circuit 301. From within the sound acoustically reproduced by and emitted from the driver 11, the acoustic reproduction component originating from the noise reduction sound signal and the noise 3' are acoustically synthesized so that the noise 3' is reduced or canceled at the noise cancel point Pc.

In the arrangement of FIG. 7, the other circuit components in the DSP 22 such as the surrounding noise evaluation section 223 are shown same as those where the first embodiment is applied, and perform quite similar operations to those of the first embodiment. Naturally, the present embodiment can be applied also to the second and third embodiments described hereinabove.

With the headphone apparatus of the fourth embodiment, a microphone provided for a different function can be used also as the microphone 12. Therefore, there is an advantage that there is no necessity to provide a new microphone for surrounding noise evaluation and decision.

It is to be noted that the different function for common use of the microphone is not limited to the noise reduction function of the feedforward type as in the example described above.

For example, a microphone for noise collection in an adaptive noise cancel system may be used.

Also it is possible to use a microphone provided in order for the user to temporarily listen to external sound while the user remains wearing a headphone.

Further, where the headphone apparatus is for a radio communication terminal having a sound reproduction function and includes a sound collecting microphone for sound communication with a different person, the microphone may be used. In this instance, the headphone apparatus includes a headset.

[Fifth Embodiment]

While the headphone apparatus of the embodiments described above are configured so as to convert a sound signal into a digital signal and perform all signal processing in digital processing, they may otherwise be configured so as to perform all signal processing in analog processing.

Figure 8:
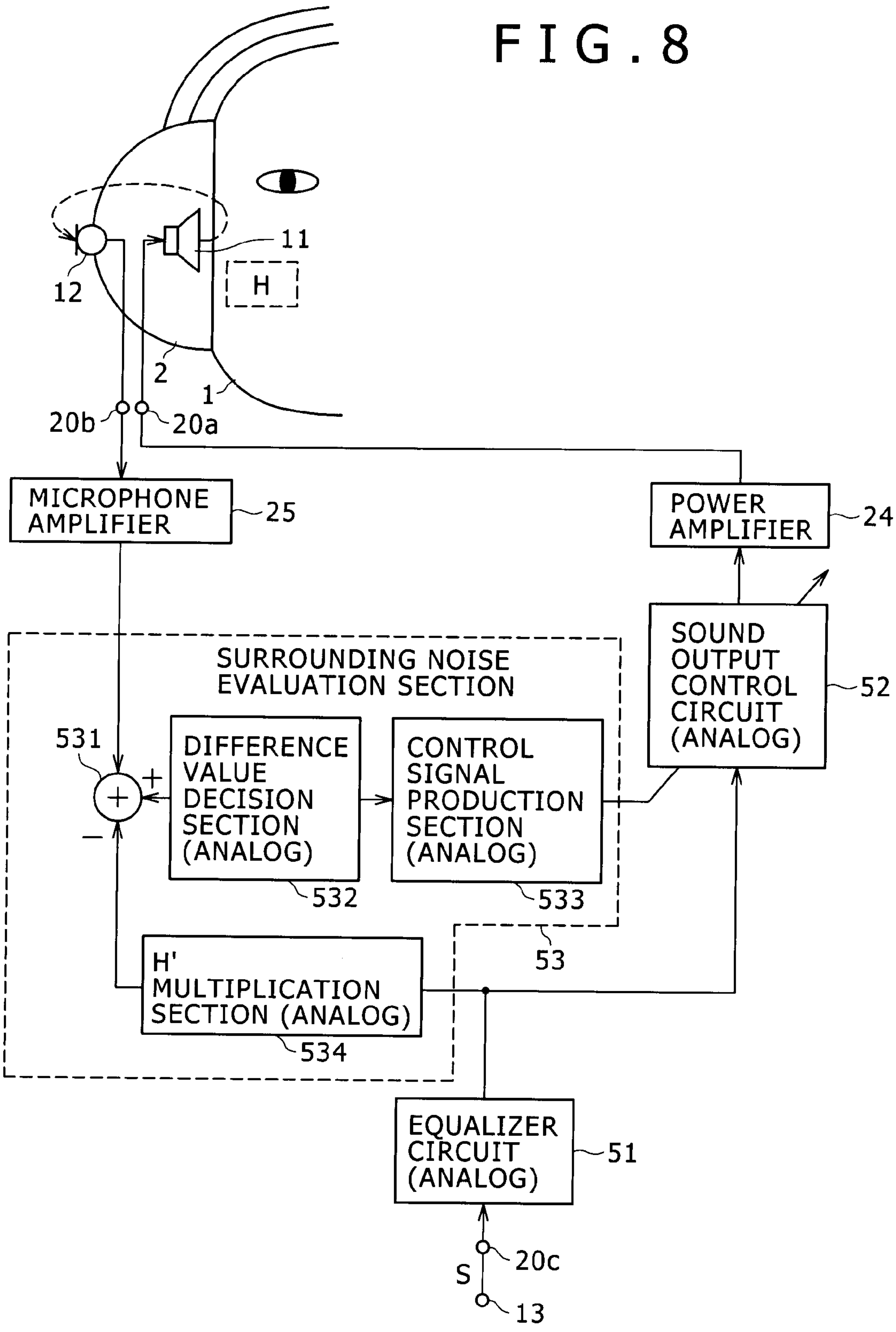

FIG. 8 shows a headphone apparatus according to a fifth embodiment of the present invention wherein all signal processing is performed in analog processing.

Referring to FIG. 8, in the present fifth embodiment, a sound signal S inputted through the sound signal input terminal 13 is supplied through an analog equalizer circuit 51 to a sound output control circuit 52 having a configuration of an analog processing circuit. The sound output control circuit 52 is formed, for example, from an analog processing circuit which reduces the gain of the sound signal supplied thereto in response to an output control signal from a surrounding noise evaluation section 53 hereinafter described to reduce the sound volume.

Meanwhile, an output signal of the analog equalizer circuit 51 is supplied to the surrounding noise evaluation section 53 of an analog processing circuit configuration. A sound signal from the microphone 12 is supplied to the surrounding noise evaluation section 53 through the microphone amplifier 25.

The surrounding noise evaluation section 53 in the present embodiment corresponds to the first example described hereinabove with reference to FIG. 3. Thus, the surrounding noise evaluation section 53 includes a subtraction circuit 531, a difference value decision section 532 of an analog processing circuit configuration, a control signal production section 533 of an analog processing circuit configuration, and an H' multiplication section 534 of an analog processing circuit configuration such as an analog filter configuration.

In particular, a sound signal from the microphone 12 is supplied through the microphone amplifier 25 to the subtraction circuit 531 while a sound signal from the analog equalizer circuit 51 is supplied to the subtraction circuit 531 after it is multiplied by a transfer function H' by the H' multiplication circuit 534. The subtraction circuit 531 subtracts the sound signal from the H' multiplication section 534 from the sound signal from the microphone 12 and supplies the difference signal between them as a subtraction output therefrom to the difference value decision section 532.

The difference value decision section 532 includes a circuit for integrating the difference signal from the subtraction circuit 531 over such a prescribed period of time to determine an energy value within the prescribed period, and a comparison circuit for comparing the determined energy value with a threshold value. Then, the difference value decision section 532 supplies a comparison output signal between the energy value and the threshold value from the comparison circuit to the control signal production section 533.

The control signal production section 533 is formed as a circuit for producing a control signal from the comparison output signal of the comparison circuit of the surrounding noise evaluation section 53. In particular, when the determined energy value of the comparison output signal is lower than the threshold value, the control signal production section 533 decides that sound leakage suppression is required and outputs, for example, a signal of the high level. However, when the determined energy value of the comparison output signal is equal to or higher than the threshold value, the control signal production section 533 decides that sound leakage suppression is not required, and outputs, for example, a signal of the low level.

When the signal from the surrounding noise evaluation section 53 has the high level, the sound output control circuit 52 reduces the gain of the sound signal supplied thereto to reduce the sound volume. However, when the signal from the surrounding noise evaluation section 53 has the low level, the sound output control circuit 52 controls the gain of the sound signal supplied thereto to "1" so that the sound signal is outputted with the gain thereof maintained.

It is to be noted that the analog configuration of FIG. 8 is an example, and any element or configuration in the embodiments of the digital configuration described above can be replaced into an analog configuration if it is possible to replace it into an analog processing circuit.

[Sixth Embodiment]

In the embodiments described above, the sound signal processing section 20 is provided in a headphone apparatus and performs surrounding noise evaluation and sound leak suppression control processes. However, it is possible not to provide the sound signal processing section 20 on the headphone apparatus side but to provide a sound processing circuit similar to that described above on the sound outputting apparatus side such as a portable music reproduction apparatus to which the headphone apparatus is connected. The sixth embodiment of the present invention has the configuration just described.

Figure 9:
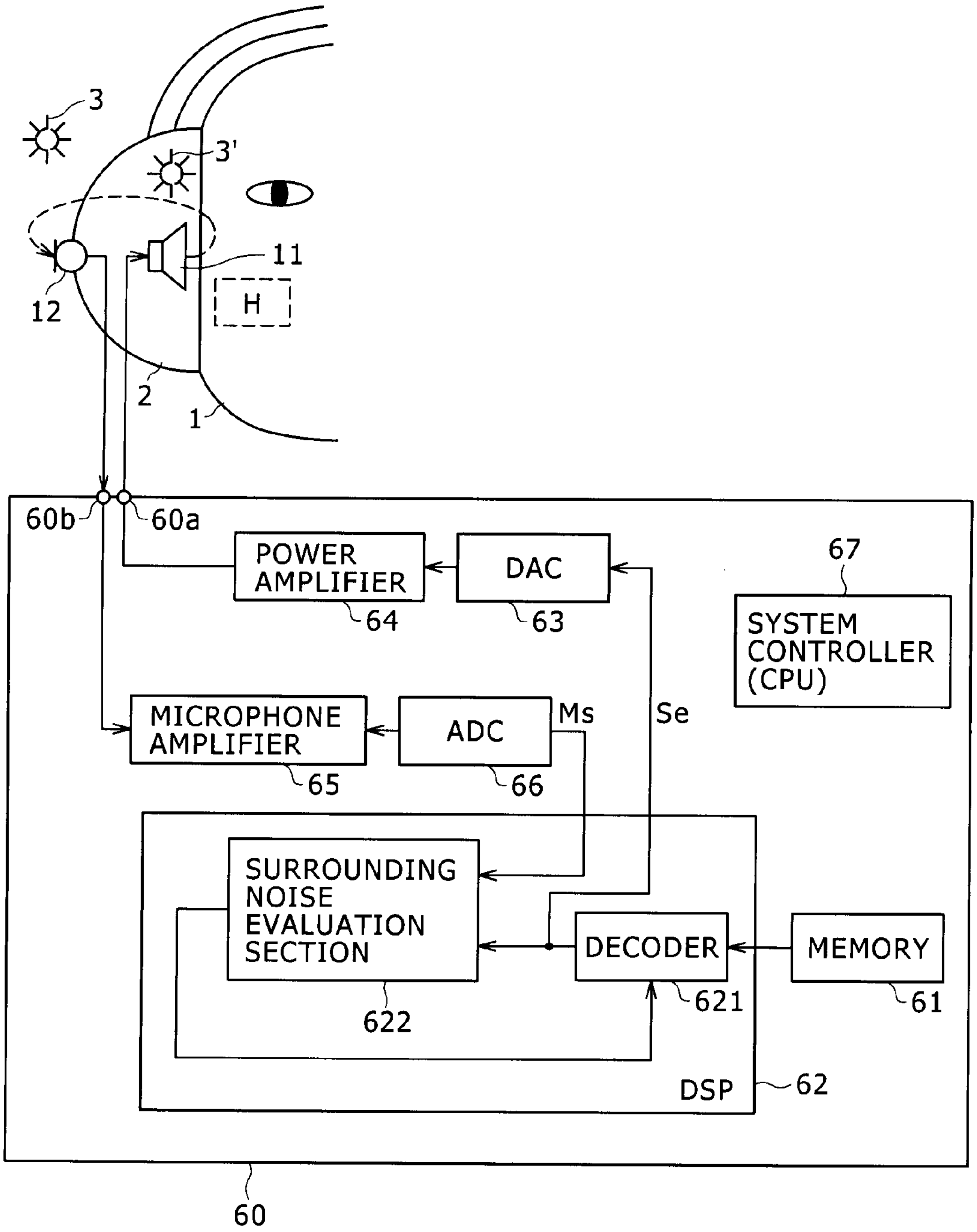
FIG. 9 is a block diagram showing a sixth embodiment of the present invention wherein a sound outputting system of the present invention is applied to a system which includes a headphone apparatus and a portable music reproduction apparatus.

FIG. 9 shows an example of a configuration of the sixth embodiment of the present invention. Particularly, FIG. 9 shows a sound outputting system including a headphone apparatus which includes a driver 11 and a microphone 12, and a portable music reproduction apparatus 60.

Referring to FIG. 9, the portable music reproduction apparatus 60 shown has a terminal 60*a* for supplying a sound signal to the driver 11 of the headphone apparatus therethrough, and a terminal 60*b* for receiving an input of a collected sound signal from the microphone 12. Each of the terminals 60*a* and 60*b* has a configuration of a plug and a jack.

In the portable music reproduction apparatus 60 in the present embodiment, music data of an object of reproduction are stored in a compressed form in a memory 61. Then, the music data are read out from the memory 61 in response to a music selection signal inputted thereto though an operation section not shown under the control of a system controller 67. The read out music data in a compressed form are decompressed or digitally equalized by a decoder 621 for music data formed in a DSP 62 to produce decoded music data Se.

Then, the decoded music data Se are supplied to a surrounding noise evaluation section 622 in the DSP 62 and also to a D/A conversion circuit 63, by which they are converted into an analog sound signal. The analog sound signal is supplied through a power amplifier 64 to and acoustically reproduced by the driver 11 of the headphone apparatus.

Meanwhile, a collected sound signal from the microphone 12 is supplied through a microphone amplifier 65 of the portable music reproduction apparatus 60 to and converted into a digital sound signal Ms by an A/D conversion circuit 66. Then, the digital sound signal Ms from the A/D conversion circuit 66 is supplied to the surrounding noise evaluation section 622 in the DSP 62.

The surrounding noise evaluation section 622 is configured in a quite similar manner to the surrounding noise evaluation section 223 described hereinabove, and evaluates and decides surrounding noise from the digital sound signal Ms and the sound signal Se supplied thereto to produce decision result information representative of whether or not such sound leakage suppression as described hereinabove is required. Then, the surrounding noise evaluation section 622 sends the produced information of the decision result to a sound outputting control circuit provided in the decoder 621 and having a sound leakage suppression control process function so that such a sound leakage suppression control process as described above is performed.

Accordingly, also in the present sixth embodiment, appropriate sound leakage control is performed quite similarly as in the first to fifth embodiments described hereinabove.

It is to be noted that the internal configuration example of the DSP 62 in the arrangement of FIG. 9 is shown in a simplified form but may naturally have a configuration similar to the configuration of the DSP 22 in the first to fifth embodiments described hereinabove.

[Other Embodiments and Modifications]

It is to be noted that, while, in the embodiments described above, the sound signals Se and Ms within a prescribed interval determined in advance are used to perform surrounding noise evaluation and decision and perform sound leakage control based on a result of the decision. However, whether or not sound leakage suppression control is required may be decided depending upon evaluation decision results when the surrounding noise evaluation and decision regarding the sound signals Se and Ms for the prescribed interval are repeated over a plurality of prescribed intervals if the evaluation decision results are same. Or, whether or not sound leakage suppression control is required may be decided based on an evaluation decision result which is dominant from among evaluation decision results when the surrounding noise evaluation and decision regarding the sound signals Se and Ms within the predetermined prescribed interval are repeated over a plurality of prescribed intervals.

It is to be noted that, where it is decided as a result when surrounding noise evaluation that the sound signal Ms is occupied almost all by external noise components and the listening environment is a noisy listening environment, if it is decided that the external noise is high, then the sound output control circuit 222 may control so as to raise the sound volume of the sound signal Se to be acoustically reproduced by the sound output control circuit 222.

Further, sound collection means includes an oscillation sensor as oscillation-electric conversion means as well as a microphone as acousto-electric conversion means.

In the embodiments described above, the sound signal processing section 20 which performs a surrounding noise evaluation process, a sound leakage suppression control process and so forth is formed using a DSP. However, a microcomputer or a microprocessor may be used in place of the DSP such that the processing of the sound processing circuit described above is performed in accordance with a software program.

Further, in the embodiments described above, the sound outputting apparatus according to the embodiments of the present invention is a headphone apparatus. However, the present invention can be applied also to an earphone apparatus or a headset apparatus which includes a microphone or a communication terminal such as a portable telephone terminal. Further as described above, the sound outputting apparatus of the present invention can be applied also to a portable music reproduction apparatus which is combined with a headphone, an earphone or a headset.

It is to be noted that the surrounding noise evaluation section 223 subtracts the reproduction object sound signal from the digital equalizer circuit 221 from the digital sound signal Ms from the A/D conversion circuit 26 taking the transfer function H into consideration. However, not the reproduction object sound signal is removed from the digital sound signal Ms in this manner, but a correlation between the reproduction object sound signal and the digital sound signal Ms may be determined by calculation. In this instance, where the correlation is high, it is decided that, while the surrounding noise is low and the listening environment is quiet, the level of the sound leak component is high. On the other hand, where the correlation is low and the level of the digital sound signal Ms is high, it is possible to determine that the listening environment is noisy.

While preferred embodiments of the present invention have been described using specific terms, such description is for illustrative purpose only, and it is to be understood that changes and variations may be made without departing from the spirit or scope of the following claims.

What is claimed is:

1. A sound outputting apparatus, comprising:

an electro-acoustic conversion section disposed in a housing and configured to acoustically reproduce a first sound signal;

a sound collection section configured to collect sound outside said housing and output a second sound signal;

a surrounding noise evaluation section configured to evaluate surrounding noise outside said housing based on the second sound signal; and a control section configured to perform predetermined control based on a result of the evaluation of said surrounding noise evaluation section, the control section determining whether the surrounding noise outside said housing results from, based on an evaluation by the surround noise evaluation section:

(1) sound leakage from the reproduction of the first sound signal, and (2) a noisy listening environment, such that the predetermined control includes maintaining an output sound volume when both (1) and (2) are relatively high, and lowering the output sound volume when only (1) is relatively high.

2. The sound outputting apparatus according to claim 1, wherein said control section controls the amount of sound to be acoustically reproduced and outputted by said electro-acoustic conversion section from the first sound signal.

3. The sound outputting apparatus according to claim 1, wherein said control section issues a warning based on the result of the evaluation of said surrounding noise evaluation section.

4. The sound outputting apparatus according to claim 1, wherein said surrounding noise evaluation section includes:

a multiplication section configured to multiply the first sound signal supplied to said control section by a coefficient according to a transfer characteristic from said electro-acoustic conversion section to said sound collection section;

a difference value calculation section configured to determine a difference value between the second sound signal and the sound signal from said multiplication section;

a decision section configured to decide the magnitude of the surrounding noise outside said housing from the difference value determined by said difference value calculation section; and a control signal production section configured to produce a control signal for controlling the amount of the sound to be supplied to said control section based on a result of the decision of said decision section.

5. The sound outputting apparatus according to claim 4, wherein said control section decreases the acoustic reproduction sound amount of the first sound signal when it is decided by said decision section that the difference value is lower than a predetermined value.

6. The sound outputting apparatus according to claim 4, wherein said control section performs a compressor process or a limiter process for the first sound signal by limiting the first sound signal to an upper limit when said decision section decides that the difference value is equal to or lower than a predetermined value.

7. The sound outputting apparatus according to claim 1, wherein said surrounding noise evaluation section includes:

a first conversion section configured to convert the first sound signal in a time domain into a third signal in a frequency domain;

a multiplication section configured to multiply the first sound signal controlled by said control section by a coefficient according to a transfer characteristic from said electro-acoustic conversion section to said sound collection section;

a second conversion section configured to convert a signal from said multiplication section into a fourth signal in the frequency domain;

a difference value calculation section configured to determine a difference value between the third signal and the fourth signal for each frequency;

a decision section configured to decide the magnitude of the surrounding noise outside said housing from the difference values determined by said difference value calculation section; and a control signal production section configured to produce a control signal for performing control of the volume of the sound to be supplied to said sound output control section based on a result of the decision of said decision section.

8. The sound outputting apparatus according to claim 7, wherein said control section decreases the acoustic reproduction sound amount of the first sound signal when it is decided by said decision section that the difference value is lower than a predetermined value.

9. The sound outputting apparatus according to claim 7, wherein said control section performs a compressor process or a limiter process for the first sound signal by limiting the first sound signal to an upper limit when said decision section decides that the difference value is equal to or lower than a predetermined value.

10. The sound outputting apparatus according to claim 1, wherein said surrounding noise evaluation section executes the evaluation in response to a determination that the momentary amplitude value or the energy value of the first sound signal or the second sound signal exceeds a fixed level or in response to a determination that the frequency amplitude value exceeds a fixed level as a result of a frequency analysis performed with regard to the first sound signal or the second sound signal.

11. The sound outputting apparatus according to claim 1, further comprising a noise reduction circuit configured to produce a noise reduction sound signal for reducing the noise outside said housing from the second sound signal obtained by the sound collection of said sound collection section and add the produced noise reduction sound signal to the second sound signal.

12. A sound outputting method, comprising the steps of:

acoustically reproducing a first sound signal, the step being executed by an electro-acoustic conversion section disposed in a housing;

collecting sound outside the housing and outputting a second sound signal, the step being executed by a sound collection section;

evaluating surrounding noise outside the housing based on the second sound signal;

performing predetermined control based on a result of the evaluation at the surrounding noise evaluation step; and determining whether the surrounding noise outside said housing results from, based on an evaluation by the evaluating step:

(1) sound leakage from the reproducing of the first sound signal, and (2) a noisy listening environment, such that the predetermined control includes maintaining an output sound volume when both (1) and (2) are relatively high, and lowering the output sound volume when only (1) is relatively high.

13. A non-transitory computer-readable recording medium on or in which a program is recorded, the program causing a computer to execute the steps of:

acoustically reproducing a first sound signal, the step being executed by an electro-acoustic conversion section disposed in a housing;

collecting sound outside the housing and outputting a second sound signal, the step being executed by a sound collection section;

evaluating surrounding noise outside the housing based on the second sound signal;

performing predetermined control based on a result of the evaluation at the surrounding noise evaluation step; and determining whether the surrounding noise outside said housing results from, based on an evaluation by the evaluating step:

(1) sound leakage from the reproducing of the first sound signal, and (2) a noisy listening environment, such that the predetermined control includes maintaining an output sound volume when both (1) and (2) are relatively high, and lowering the output sound volume when only (1) is relatively high.

14. A sound outputting system, comprising:

a headphone apparatus; and a sound outputting apparatus to which said headphone apparatus is connected;

said headphone apparatus including an electro-acoustic conversion section disposed in a housing of said headphone apparatus and configured to acoustically reproduce and output a first sound signal from said sound outputting apparatus, and a sound collection section configured to collect sound outside said housing of said headphone apparatus, said sound outputting apparatus including a surrounding noise evaluation section configured to evaluate surrounding noise outside said housing based on the second sound signal obtained by the sound collection by said sound collection section, and a control section configured to perform predetermined control based on a result of the evaluation of the surrounding noise outside said housing by said surrounding noise evaluation section, the control section determining whether the surrounding noise outside said housing results from, based on an evaluation by the surround noise evaluation section:

(1) sound leakage from the reproduction of the first sound signal, and (2) a noisy listening environment, such that the predetermined control includes maintaining an output sound volume when both (1) and (2) are relatively high, and lowering the output sound volume when only (1) is relatively high.

* * * * *